(12) United States Patent
Kim et al.

(10) Patent No.: US 10,319,424 B1
(45) Date of Patent: Jun. 11, 2019

(54) ADJUSTABLE CURRENT SELECTORS

(71) Applicant: SPIN MEMORY, INC., Fremont, CA (US)

(72) Inventors: Kuk-Hwan Kim, San Jose, CA (US); Gian Sharma, Fremont, CA (US); Amitay Levi, Cupertino, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/865,125

(22) Filed: Jan. 8, 2018

(51) Int. Cl.
  *G11C 11/16* (2006.01)
  *H01L 27/22* (2006.01)

(52) U.S. Cl.
  CPC ........ *G11C 11/1673* (2013.01); *G11C 11/161* (2013.01); *G11C 11/165* (2013.01); *G11C 11/1675* (2013.01); *H01L 27/228* (2013.01)

(58) Field of Classification Search
  CPC . G11C 11/1673; G11C 11/161; G11C 11/165; G11C 11/1675; H01L 27/228
  See application file for complete search history.

(56) References Cited

U.S. PATENT DOCUMENTS

| | | | |
|---|---|---|---|
| 4,910,709 A * | 3/1990 | Dhong | G11C 11/404 257/E27.026 |
| 5,656,842 A | 8/1997 | Iwamatsu et al. | |
| 5,717,373 A | 2/1998 | Vachris | |
| 7,224,601 B2 | 5/2007 | Panchula | |
| 7,800,938 B2 | 9/2010 | Rivkin | |
| 7,872,905 B2 | 1/2011 | Florez Marino | |
| 7,936,597 B2 | 5/2011 | Clinton et al. | |
| 8,008,706 B2 | 8/2011 | Choi et al. | |
| 8,077,509 B2 | 12/2011 | Yanagi | |
| 8,107,280 B2 | 1/2012 | Yoon et al. | |
| 8,179,711 B2 * | 5/2012 | Kim | G11O 5/02 365/148 |
| 8,194,361 B2 | 6/2012 | Kudo | |
| 8,199,553 B2 | 6/2012 | Chen | |
| 8,203,389 B1 | 6/2012 | Zhou | |
| 8,345,474 B2 | 1/2013 | Oh et al. | |
| 8,353,568 B2 | 1/2013 | Lee | |
| 8,416,539 B2 | 4/2013 | Carey | |
| 8,421,440 B2 | 4/2013 | Oksanen | |

(Continued)

OTHER PUBLICATIONS

Bhatti et al., "Spintronics based random access memory: a review," Materials Today, vol. 20, No. 9, 530-548, Nov. 2017, from http://dx.doi.org/10.1016/j.mattod.2017.07.007, 19 pgs.

(Continued)

*Primary Examiner* — Vanthu T Nguyen
(74) *Attorney, Agent, or Firm* — Morgan, Lewis & Bockius LLP

(57) ABSTRACT

The various implementations described herein include methods, devices, and systems for performing operations on memory devices. In one aspect, a memory device includes: (1) a magnetic memory component; and (2) a current selector component coupled to the magnetic memory component, the current selector component including: (a) a first transistor having a first gate with a corresponding first threshold voltage; and (b) a second transistor having a second gate with a corresponding second threshold voltage, distinct from the first threshold voltage; where the second transistor is coupled in parallel with the first transistor.

12 Claims, 15 Drawing Sheets

(56) References Cited

U.S. PATENT DOCUMENTS

| | | | |
|---|---|---|---|
| 8,508,973 | B2 | 8/2013 | Jin |
| 8,633,720 | B2 | 1/2014 | Tudosa |
| 8,817,546 | B2 | 8/2014 | Wang |
| 9,110,746 | B2 | 8/2015 | Zhu |
| 9,142,277 | B2 * | 9/2015 | Kim .................... G11C 11/1695 |
| 9,166,147 | B2 | 10/2015 | Carman |
| 9,208,878 | B2 * | 12/2015 | Iyer .................... G11C 14/0018 |
| 9,230,571 | B1 | 1/2016 | Chen |
| 9,240,799 | B1 | 1/2016 | Wang |
| 9,337,415 | B1 | 5/2016 | Oh et al. |
| 9,443,905 | B1 | 9/2016 | Bandic et al. |
| 9,460,769 | B2 | 10/2016 | Nozaki |
| 9,502,133 | B2 * | 11/2016 | Ueda .................... H01L 29/7869 |
| 9,503,097 | B2 | 11/2016 | Lee |
| 9,525,126 | B1 | 12/2016 | Lin |
| 9,595,917 | B2 | 3/2017 | Kan |
| 9,608,043 | B2 | 3/2017 | Shimabukuro et al. |
| 9,660,183 | B2 | 5/2017 | Wang |
| 9,734,882 | B2 * | 8/2017 | Toh .................... G11C 11/165 |
| 9,741,926 | B1 | 8/2017 | Pinarbasi et al. |
| 9,766,705 | B2 | 9/2017 | Chan |
| 9,773,913 | B1 | 9/2017 | Balakrishnan et al. |
| 2003/0183889 | A1 | 10/2003 | Kajiyama |
| 2005/0073878 | A1 | 4/2005 | Lin et al. |
| 2005/0184348 | A1 | 8/2005 | Youn et al. |
| 2006/0152969 | A1 | 7/2006 | Trouilloud |
| 2007/0201265 | A1 | 8/2007 | Ranjan et al. |
| 2007/0210338 | A1 | 9/2007 | Orlowski |
| 2009/0032849 | A1 | 2/2009 | Higashino |
| 2010/0052029 | A1 | 3/2010 | Huang |
| 2010/0102290 | A1 | 4/2010 | Lu et al. |
| 2010/0187601 | A1 | 7/2010 | Masuoka et al. |
| 2011/0062515 | A1 | 3/2011 | Masuoka et al. |
| 2012/0217468 | A1 | 8/2012 | Tekleab et al. |
| 2012/0313742 | A1 | 12/2012 | Kurs et al. |
| 2013/0200467 | A1 | 8/2013 | Edge et al. |
| 2013/0258763 | A1 | 10/2013 | Ranjan et al. |
| 2014/0008606 | A1 | 1/2014 | Hussain et al. |
| 2014/0050019 | A1 | 2/2014 | Lee et al. |
| 2014/0151830 | A1 | 6/2014 | Apalkov et al. |
| 2014/0151831 | A1 | 6/2014 | Chen et al. |
| 2014/0170821 | A1 | 6/2014 | Nyhus et al. |
| 2014/0264513 | A1 | 9/2014 | De Brosse et al. |
| 2014/0264552 | A1 | 9/2014 | Prabhakar |
| 2015/0014748 | A1 | 1/2015 | Zaitsu |
| 2015/0021675 | A1 | 1/2015 | Min |
| 2015/0138873 | A1 | 5/2015 | Lu et al. |
| 2015/0179266 | A1 | 6/2015 | Park |
| 2015/0279904 | A1 | 10/2015 | Pinarbasi et al. |
| 2016/0079361 | A1 | 3/2016 | Ching et al. |
| 2016/0225818 | A1 * | 8/2016 | Toh .................... G11C 11/1675 |
| 2016/0240542 | A1 | 8/2016 | Kwon |
| 2016/0315249 | A1 | 10/2016 | Kardasz et al. |
| 2016/0372656 | A1 | 12/2016 | Pinarbasi et al. |
| 2017/0005106 | A1 | 1/2017 | Zhang |
| 2017/0178705 | A1 | 6/2017 | Buhrman et al. |
| 2017/0317070 | A1 | 11/2017 | Salcedo et al. |
| 2018/0075895 | A1 * | 3/2018 | Kishi .................... G11C 7/1096 |
| 2018/0096896 | A1 | 4/2018 | Zhu |
| 2018/0269210 | A1 | 9/2018 | Tezuka |
| 2018/0308534 | A1 | 10/2018 | Gaudin et al. |

OTHER PUBLICATIONS

Chen et al., "On-Chip Caches Built on Multilevel Spin-Transfer Torque RAM Cells and Its Optimizations," ACMJournal on Emerging Technologies in Computing Systems, vol. 9, No. 2, Article 16, May 2013, 22 pgs.

Chen et al., "Processor Caches Built Using Multi-Level Spin-Transfer Torque RAM Cells," Jun. 2011 © 2011 IEEE, 6 pgs.

Dyakonov, M. I., "Spin Hall Effect," arXiv:1210.3200v1 (2010), from https://arxiv.org/ftp/arxiv/papers/1210/1210.3200.pdf, 12 pgs.

Eitan et al., "NROM: A Novel Localized Trapping, 2-Bit Nonvolatile Memory Cell," IEEE Electron Device Letters, vol. 21, No. 11, Nov. 2000, 3 pgs.

Jiang et al., "Constructing Large and Fast Multi-Level Cell STT-RAM based Cache for Embedded Processors," DAC 20125, Jun. 3-7, 2012, San Francisco, California, 6 pgs.

Li Gao, "Spin Polarized Current Phenomena in Magnetic Tunnel Junctions," Ph.D. Dissertation, Stanford University, Sep. 2009, 126 pgs.

Li et al., A New Self-reference Sensing Scheme for TLC MRAM, Sep. 2015 © 2015 IEEE, 4 pgs.

Sbiaa et al., "Materials with perpendicular magnetic anisotropy for magnetic random access memory," Phys. Status Solidi RRL 5, No. 12, 413-419 (2011) / DOI: 10.1002/pssr.201105420, 7 pgs.

van den Brink et al., "Spin-Hall-assisted magnetic random access memory," Applied Physics Letters, 104, 012403 (2014), 4 pgs.

Vincent et al., "Spin-Transfer Torque Magnetic Memory as a Stochastic Memristive Synapse for Neuromorphic Systems," IEEE Transactions on Biomedical Circuits and Systems, vol. 9, No. 2, Apr. 2015, 9 pgs.

Wang et al., "Spintronic materials and devices based on antiferromagnetic metals," Progress in Natural Science: Materials International, Oct. 23, 2016, 27 (2017) 208-216, 9 pgs.

Yuen et al., "A 2-Bit MONOS Nonvolatile Memory Cell Based on Asymmetric Double Gate MOSFET Structure," IEEE Electron Device Letters, vol. 24, No. 8, Aug. 2003, 3 pgs.

Zhang et al., "MLC STT-RAM Design Considering Probabilistic and Asymmetric MTJ Switching," Mar. 2013 © 2013 IEEE, 4 pgs.

Zhang et al., Multi-level Cell STT-RAM: Is it Realistic or Just a Dream?, IEEE/ACM International Conference on Computer-Aided Design, Nov. 5-8, 2012, San Jose, California, 8 pgs.

Bozdag, Office Action dated Jul. 18, 2018, U.S. Appl. No. 15/859,259, 15 pgs.

Sharma, Notice of Allowance dated Sep. 13, 2018, U.S. Appl. No. 15/865,138, 17 pgs.

Beleggia et al., "Phase Diagram for Magnetic Nano-Rings, May 27, 2005, Journal of Magnetism and Magnetic Materials," 16 pgs.

Fernandez-Pacheco et al., "Three-dimensional nanomagnetism," Nat. Comm. 8, 15756 ( 2017).

Laczkowski et al., "Large enhancement of the spin Hall effect in Au by side-jump scattering on Ta impurities," Phys. Rev. B 96, 140405(R) (2017).

Lavrijsen et al., "Magnetic ratchet for three-dimensional spintronic memory and logic," Nature 493, pp. 647-650 (2013).

Lavrijsen et al., "Multi-bit operations in vertical spintronic shift registers," Nanotechnology 25, 105201 (2014).

Lavrijsen et al., "Tuning the interlayer exchange coupling between single perpendicularly magnetized CoFeB layers," Appl. Phys. Lett. 100, 052411 (2012).

Lee et al., "Domain Imaging During Soliton Propagation in a 3D Magentic Ratchet," Spin 3(4), 1340013 (2013).

Lee et al., "Soliton propagation in micron-sized magnetic ratchet elements," Appl. Phys. Lett. 104, 232404 (2014).

Mansell et al., "A magnetic shift register with out-of-plane magnetized layers," Nanotechnology 28, 385201 (2017).

Mansell et al., "A robust soliton ratchet using combined antiferromagnetic and ferromagnetic interlayer couplings," Appl. Phys. Lett. 106, 092404 (2015).

Parkin, "Systematic Variation of the Strength and Oscillation Period of Indirect Magnetic Exchange Coupling through the 3d, 4d, and 5d Transition Metals," Phys. Rev. Lett. 67(25), pp. 3598-3601 (1991).

Petit et al., "Systematic layer-by-layer characterization of multilayers for three-dimensional data storage and logic," Nanotechnology 27, 155203 (2016).

Tzoufras, Office Action dated Sep. 27, 2018, U.S. Appl. No. 15/859,157, 14 pgs.

Tzoufras, Office Action dated Nov. 9, 2018, U.S. Appl. No. 15/858,808, 8 pgs.

Bozdag, Final Office Action dated Dec. 3, 2018, U.S. Appl. No. 15/859,259, 14 pgs.

Bozdag, Office Action, U.S. Appl. No. 15/859,256, dated Jan. 22, 2019, 12 pgs.

Kim, Office Action dated Nov. 28, 2018, U.S. Appl. No. 15/865,144, 9 pgs.

(56) References Cited

OTHER PUBLICATIONS

Sharma, Notice of Allowance dated Sep. 25, 2018, U.S. Appl. No. 15/865,140, 10pgs.
Sharma, Notice of Allowance dated Sep. 26, 2018, U.S. Appl. No. 15/865,132, 11 pgs.
Sharma, Notice of Allowance dated Sep. 24, 2018, U.S. Appl. No. 15/865,123, 11 pgs.

* cited by examiner

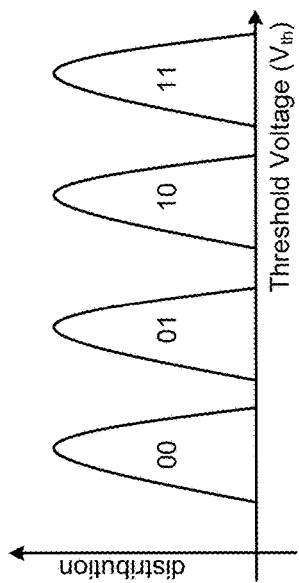
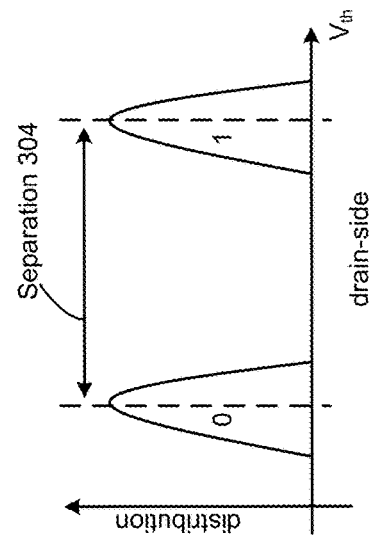
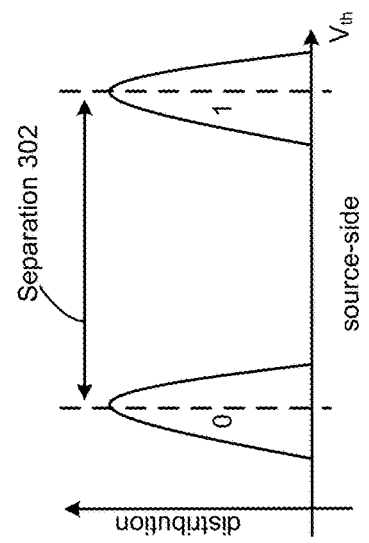
Figure 4A
Figure 4B
Figure 4C

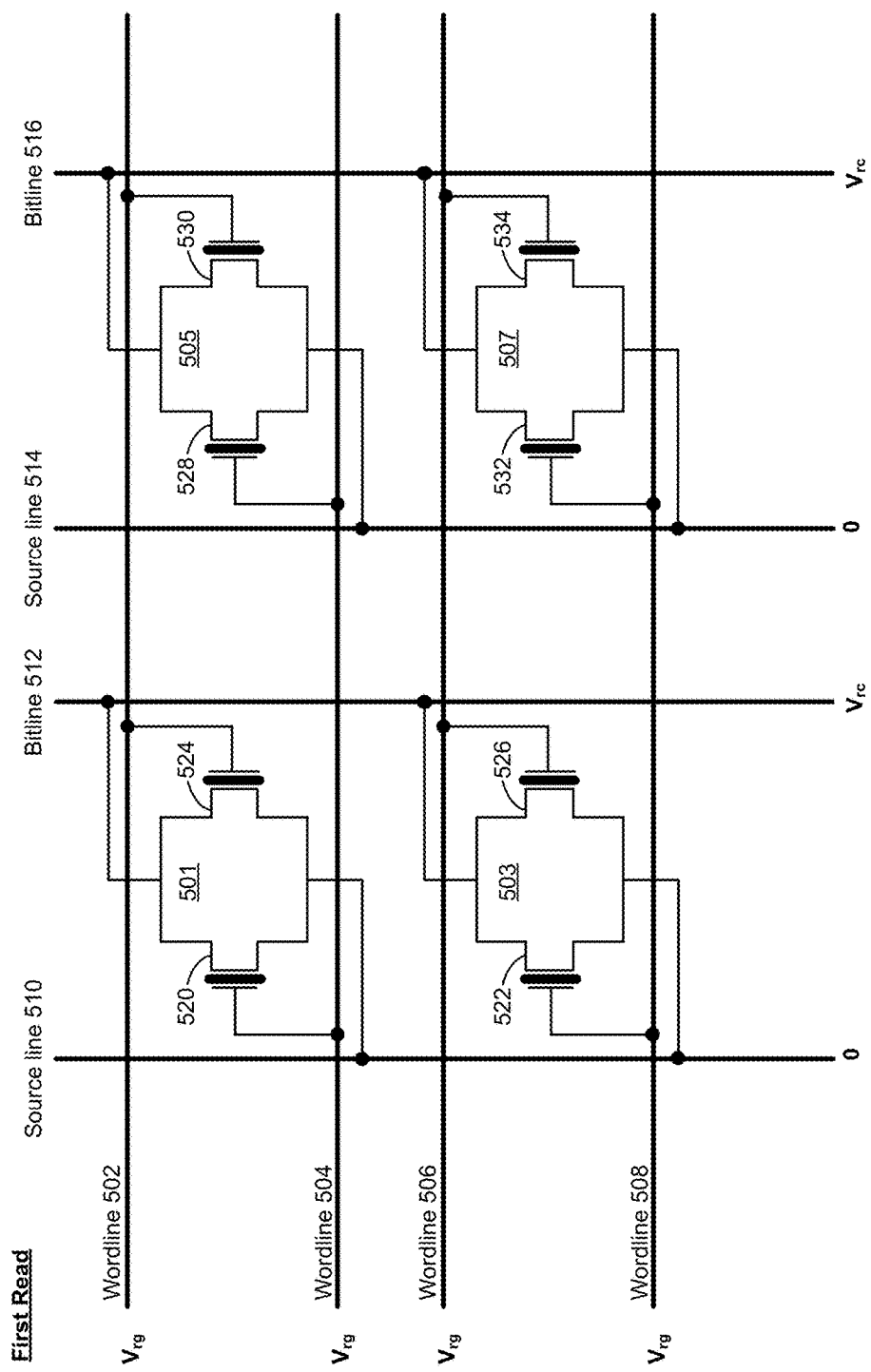

ADJUSTABLE CURRENT SELECTORS

RELATED APPLICATIONS

This application is related to U.S. Utility patent application Ser. No. 15/865,135, entitled "Dual Threshold Voltage Devices," filed Jan. 8, 2018," U.S. Utility patent application Ser. No. 15/865,138, entitled "Dual Threshold Voltage Devices with Stacked Gates," filed Jan. 8, 2018, U.S. Utility patent application Ser. No. 15/865,140, entitled "Methods of Fabricating Dual Threshold Voltage Devices," filed Jan. 8, 2018," U.S. Utility patent application Ser. No. 15/865,132, entitled "Methods of Fabricating Dual Threshold Voltage Devices with Stacked Gates," filed Jan. 8, 2018, U.S. Utility patent application Ser. No. 15/865,123, entitled "Methods of Fabricating Contacts for Cylindrical Devices," filed Jan. 8, 2018," U.S. Utility patent application Ser. No. 15/865,144, entitled "Dual Gate Memory Devices," filed Jan. 8, 2018, each of which is incorporated by reference herein in its entirety.

TECHNICAL FIELD

This relates generally to the field of memory applications and voltage devices, including but not limited to dual threshold voltage devices.

BACKGROUND

The field of memory applications is becoming more challenging as the performance requirements for memory-based devices increase. Because of the many useful properties of dual threshold voltage devices (e.g., adjustability, density, and drivability), memory systems comprising dual threshold voltage devices have superior performance over conventional memory systems.

Analog compensation techniques could be utilized to compensate for different bit error rates and temperature dependency. However, analog compensation techniques are very complex and consume good portions of both silicon area and power. Moreover, the analog circuits themselves are susceptible to both temperature and supply voltage.

SUMMARY

There is a need for systems and/or devices with more efficient, accurate, and effective methods for operating memory systems. Such systems, devices, and methods optionally complement or replace conventional systems, devices, and methods for fabricating and/or operating memory systems.

The present disclosure describes various implementations of dual threshold (e.g., dual gate) voltage devices and systems. As discussed in greater detail below, dual threshold voltage devices are able to store multiple bits in a compact layout. Thus, memory arrays can be produced using the dual threshold voltage devices as memory cells. In addition, dual threshold voltage devices can be implemented as current and/or voltage selectors for other circuit components, such as magnetic memory devices. Some magnetic memory devices require inputs with multiple voltage levels in order to effectively read and write from the devices. The dual threshold voltage devices are optionally used (e.g., in place of larger, more complex analog circuitry) to modulate a voltage or current source so as to provide the required voltage/current levels. Moreover, the input voltage requirements of some magnetic memory devices vary with the temperature of the magnetic memory devices. To achieve a desirable bit error rate (BER) across multiple temperatures, without excessive power consumption, a dual-threshold voltage is used in some implementations to regulate the input voltage/current for the magnetic memory device based on temperature.

There are significant advantages to using dual threshold voltage devices rather than conventional analog circuits. For example, in order to tune currents which are supplied to a magnetic tunnel junction (MTJ) device (e.g., a perpendicular magnetic tunnel junction (pMTJ) device) through access transistor, either a complex analog current supplying block has to be designed or many analog voltages have to be generated and feed into the access transistor. Single analog voltage generation needs a significant size block. In order to achieve various BER or operation at various temperatures, many of the analog voltages are needed. Therefore, a significant portion of silicon area is dedicated to those analog circuits.

Using trimmable voltage threshold ($V_{th}$) devices as a selector device for the pMTJ is beneficial over analog circuitry in terms of both power and silicon area. The selector device itself is optionally individually adjusted to the coupled pMTJ and offers a very wide range of tenability in terms of current modulation.

In one aspect, some implementations include a memory device having: (1) a first charge storage device having a first gate with a corresponding first threshold voltage, the first charge storage device configured to store charge corresponding to one or more first bits; and (2) a second charge storage device having a second gate with a corresponding second threshold voltage, distinct from the first threshold voltage, the second charge storage device configured to store charge corresponding to one or more second bits; where the second charge storage device is coupled in parallel with the first charge storage device.

In some implementations, the first charge storage device is configured to: (1) store charge corresponding to a first bit of the one or more first bits on a drain-side of the first gate; and (2) store charge corresponding to a second bit of the one or more first bits on a source-side of the first gate.

In some implementations, each charge storage device is configured to selectively store multiple amounts of charge (e.g., using floating gate or charge trap technology), each amount corresponding to a distinct logic state. For example, each charge storage device is configured to store four different amounts of electrons, corresponding to 00, 01, 10, and 11 states. In this example, the memory device states correspond to 8 bits of data.

In another aspect, some implementations include a memory device having: (1) a magnetic memory component; (2) a current selector component coupled to the magnetic memory component, the current selector component including: (a) a first transistor having a first gate with a corresponding first threshold voltage; and (b) a second transistor having a second gate with a corresponding second threshold voltage, distinct from the first threshold voltage; where the second transistor is coupled in parallel with the first transistor.

In some implementations, the current selector component is configured to selectively supply a plurality of currents to the magnetic memory component. In some implementations, the memory device includes control circuitry configured to select a particular current of the plurality of currents based on a temperature of the magnetic memory component.

Thus, devices and systems are provided with methods operating memory systems, thereby increasing the effectiveness, efficiency, and user satisfaction with such systems and devices.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 4A-4C are graphical representations illustrating prophetic voltage distributions in a representative dual threshold memory device in accordance with some implementations.

FIGS. 7A-7B illustrate a read process for the representative memory array of FIG. 5 in accordance with some implementations.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

As described in greater detail below, dual threshold voltage devices have many useful properties. First, dual threshold voltage devices are able to store multiple bits (e.g., 2 bits or 4 bits per cell) in a compact layout. Second, dual threshold voltage devices can be implemented as current and/or voltage selectors for magnetic memory devices. For example, to achieve a desirable bit error rate (BER) across multiple temperatures, without excessive power consumption, a dual-threshold voltage is used in some implementations to regulate the input voltage/current for the magnetic memory device based on temperature.

Figure 1A:
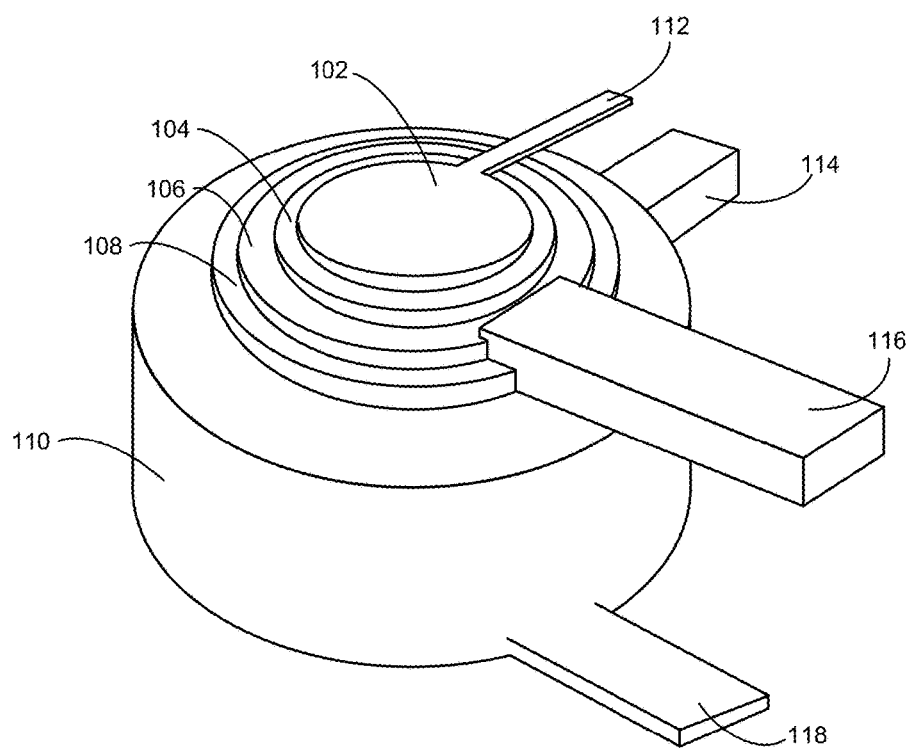
FIGS. 1A-1B illustrate a representative dual threshold voltage device in accordance with some implementations.
Figure 1B:
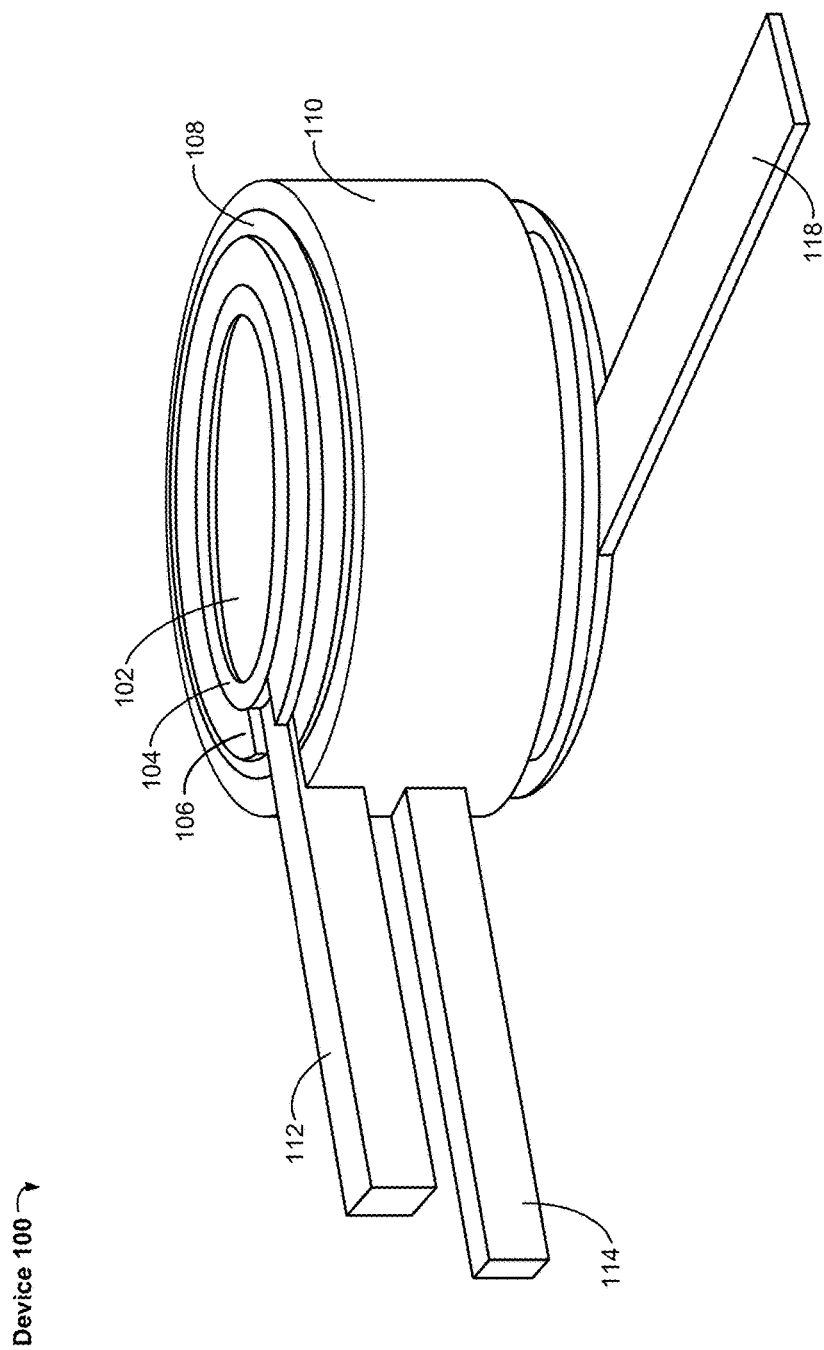

FIGS. 1A-1B illustrate a dual threshold voltage device 100 in accordance with some implementations. In some implementations, the device 100 includes a core 102 and a plurality of layers that surround the core in succession, including a first (e.g., innermost) layer 104, a second layer 106, a third layer 108 and a fourth (e.g., outermost) layer 110. In some implementations, the core 102, the first layer 104 and the second layer 106 correspond to a first transistor. In some implementations, the second layer 106, the third layer 108 and the fourth layer 110 correspond to a second transistor. In some implementations, the second layer 106 is a common channel drain (e.g., coupled to drain terminal 116) for the first transistor and the second transistor. In some implementations, the device further includes a first input terminal 112 (e.g., Gate 1) that is coupled to the core 102 and the first input terminal 112 is configured to receive a first current (e.g., is configured to have a first threshold voltage). In some implementations, the device further includes a second input terminal 114 (e.g., Gate 2) that is coupled to the fourth layer 110 and the second input terminal 114 is configured to receive a second current. The device further includes a common source terminal 118 that is coupled to the core 102 and the fourth layer 110.

In some implementations, the core is vertical and cylindrical in shape. In some implementations, the plurality of layers annularly surrounds the vertical cylindrical core and the core surrounded by the plurality of layers creates a cylindrical pillar (e.g., device 100 is shaped as a cylindrical pillar). For example, the cylindrical pillar includes the core 102, the first layer 104, the second layer 106, the third layer 108, and the fourth layer 110. Further, in this example, the cylindrical pillar includes the first input terminal 112, the second input terminal 114 and the drain terminal 116. In some implementations, the core is composed of a tantalum alloy (e.g., TaN). In some implementations, the device further comprises a cylindrical drain contact 104 that is coupled to the common source 118.

In some implementations, the core 102 is composed of a conductive material, the first layer 104 is a first dielectric layer that surrounds the core 102, the second layer 106 surrounds the first dielectric layer 104, the third layer 108 is a third dielectric layer that surrounds the second layer 106 and the fourth layer 110 is composed of a conductive material and surrounds the third dielectric layer 108. For example, the fourth layer may be the outermost layer. In some implementations, the fourth layer 110 is composed of a polycide. In some implementations, the first input terminal 112 and the second input terminal 114 are at distinct positions along the perimeter of the device (e.g., as shown in FIG. 1A), while in other implementations, the first input terminal 112 and the second input terminal 114 are aligned (e.g., as shown in FIG. 1B).

Figure 2A:
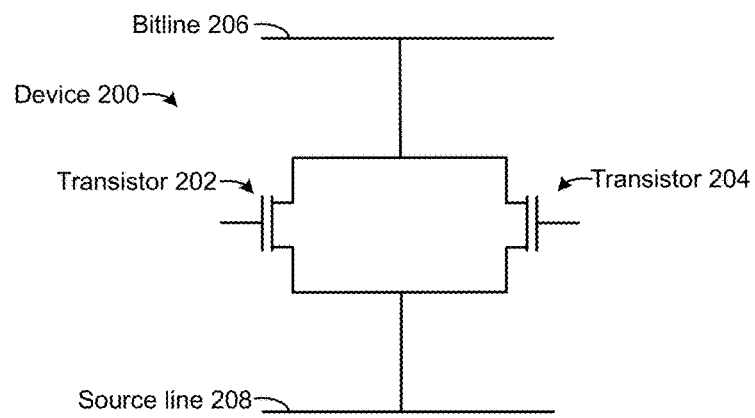
FIGS. 2A-2B are schematic diagrams illustrating representative circuits with dual threshold voltage devices in accordance with some implementations.
Figure 2B:
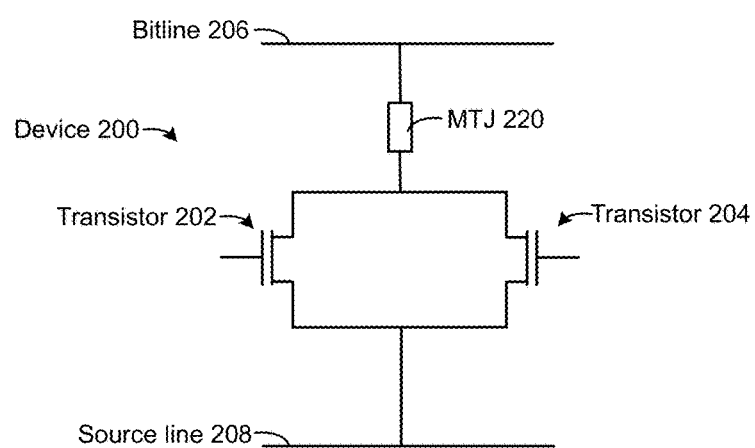

FIGS. 2A-2B are schematic diagrams illustrating representative circuits with dual threshold voltage devices in accordance with some implementations. FIG. 2A shows a device 200 including transistors 202 and 204. In accordance with some implementations, the device 200 comprises device 100, where the first input terminal 112 corresponds to the gate of the transistor 202 and the second input terminal 114 corresponds to the gate of the transistor 204. In some implementations, the device 200 is coupled to a bitline 206, e.g., the drains of the transistors 202 and 204 are coupled to the bitline 206. In some implementations, the device 200 is coupled to a source line 208, e.g., the sources of the transistors 202 and 204 are coupled to the source line 208.

FIG. 2B shows the device 200 coupled in series with a magnetic tunnel junction (MTJ) memory device 220. MTJ structures are used for magnetoresistive random access memory (MRAM), which is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

MRAM stores data through magnetic storage elements. These elements typically include two ferromagnetic films or layers that can hold a magnetic field and are separated by a non-magnetic material. In general, one of the layers has its magnetization pinned (e.g., a "reference layer"), meaning that this layer requires a large magnetic field or spin-polarized current to change the orientation of its magnetization. The second layer is typically referred to as the storage, or free, layer and its magnetization direction can be changed by a smaller magnetic field or spin-polarized current relative to the reference layer.

Due to the spin-polarized electron tunneling effect, the electrical resistance of the cell changes due to the orientation of the magnetization of the two layers. A memory cell's resistance will be different for the parallel and anti-parallel states and thus the cell's resistance can be used to distinguish between a "1" and a "0". One important feature of MRAM devices is that they are non-volatile memory devices, since they maintain the information even when the power is off. In particular, the layers can be sub-micron in lateral size and the magnetization direction can still be stable over time and with respect to thermal fluctuations.

In accordance with some implementations, the MTJ 220 is composed of a first ferromagnetic layer (a reference layer), a second ferromagnetic layer (a storage layer), and a non-magnetic layer (a spacer layer). The reference layer is also sometimes referred to as a pinned or fixed layer. The storage layer is also sometimes referred to as a free layer. The spacer layer is also sometimes referred to as a barrier layer. In some implementations, the spacer layer comprises an electrically-conductive material such as a metal. In some implementations, the spacer layer comprises an electrically-insulating material such as magnesium oxide (MgO).

In some implementations, the MTJ 220 is a perpendicular (or out-of-plane) MTJ. In this instance, the magnetic moments of the reference layer and the storage layer, and correspondingly their magnetization direction, are oriented perpendicular and out-of-plane to the ferromagnetic films of the reference layer and the storage layer.

For an MRAM device with the MTJ structure 220, the resistance states of the MRAM devices are different when the magnetization directions of the reference layer and the storage layer are aligned in a parallel (low resistance state) configuration or in an anti-parallel (high resistance state) configuration. Thus, by changing the magnetization direction of the storage layer relative to that of the reference layer, the resistance states of the MTJ structure 220 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1".

During a read/write operation, a voltage is applied between the bit line 206 and the source line 208 (e.g., corresponding to a "0" or "1" value), and the word lines coupled to the gates of the transistors 202 and 204 enable current to flow between the bit line to the source line. In a write operation, the current is sufficient to change a magnetization of the storage layer and thus, depending on the direction of electron flow, bits of "0" and "1" are written into the MTJ 220. In a read operation, the current is insufficient to change the magnetization of the storage layer. Instead, a resistance across the MTJ 220 is determined. e.g., with a low resistance corresponding to a logical "0" and a high resistance corresponding to a logical "1."

In some implementations, the voltage applied across the MTJ 220 is adjusted based on a state of the device 200. For example, if both transistors 202 and 204 are enabled (e.g., a voltage is applied to the gate of each transistor) then a larger voltage is provided to the MTJ 220 than if only one of the transistors 202 and 204 is enabled. In some implementations, the device 200 supplies distinct currents to the MTJ based on which of the transistors 202 and 204 is enabled, e.g., if both transistors are enabled a larger current is supplied than if only one of the transistors 202 and 204 is enabled.

Figure 2C:
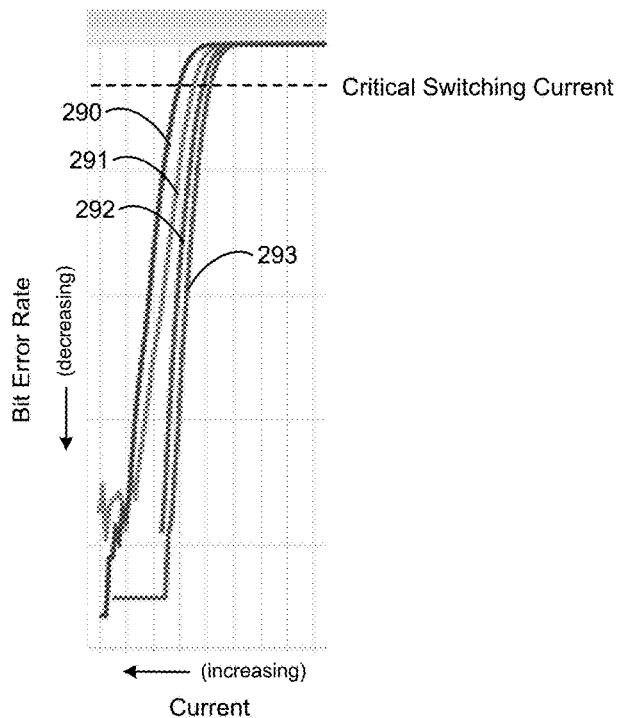
FIGS. 2C-2D are graphical representations of representative operating conditions of magnetic memory devices in accordance with some implementations.
Figure 2D:
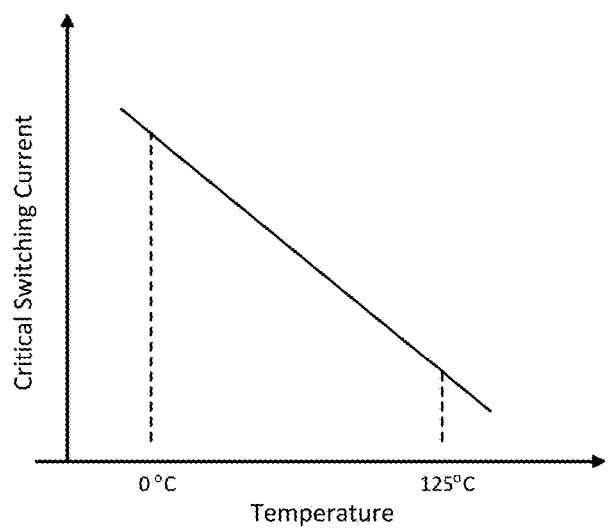

FIGS. 2C-2D are graphical representations of prophetic operating conditions of magnetic memory devices in accordance with some implementations. FIG. 2C illustrates bit error rates for an MTJ as a function of input current and temperature. In FIG. 2C curve 293 represents a first temperature, curve 292 represents a second temperature (lower than the first), curve 291 represents a third temperature (lower than the second), and curve 290 represents a fourth temperature (lower than the third). As shown in FIG. 2C, as the input current increases (becomes more negative) the bit error rate decreases. Also, as the temperature decreases, more current is needed to lower the bit error rate for the MTJ. The critical switching current in FIG. 2C is the input current corresponding to a 50% bit error rate.

FIG. 2D illustrates a relationship between critical switching current ($I_{c0}$) and temperature for an MTJ (e.g., for a perpendicular MTJ). In accordance with some implementations, as temperature decreases the critical switching current increases (e.g., more current is required to switch the state of the MTJ). In some implementations, one to two percent more switching current is needed per one degree Celcius decrease in temperature. In some implementations and instances, the temperature dependency of $I_{c0}$ is linear as a function of temperature.

Figure 2E:
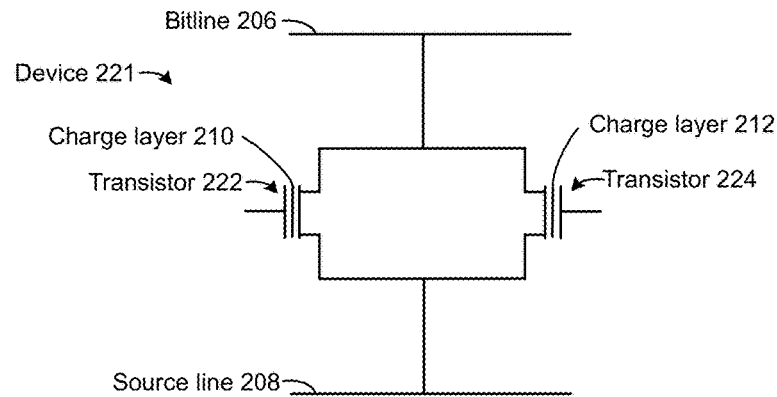
FIGS. 2E-2H are schematic diagrams illustrating representative circuits with dual threshold memory devices in accordance with some implementations.
Figure 2F:
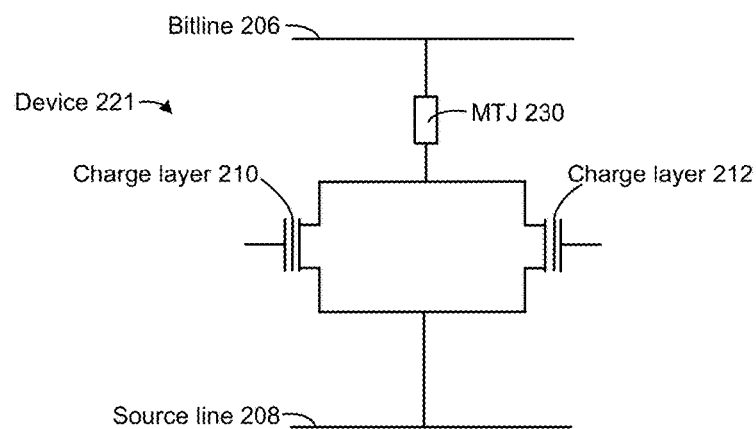
Figure 2G:
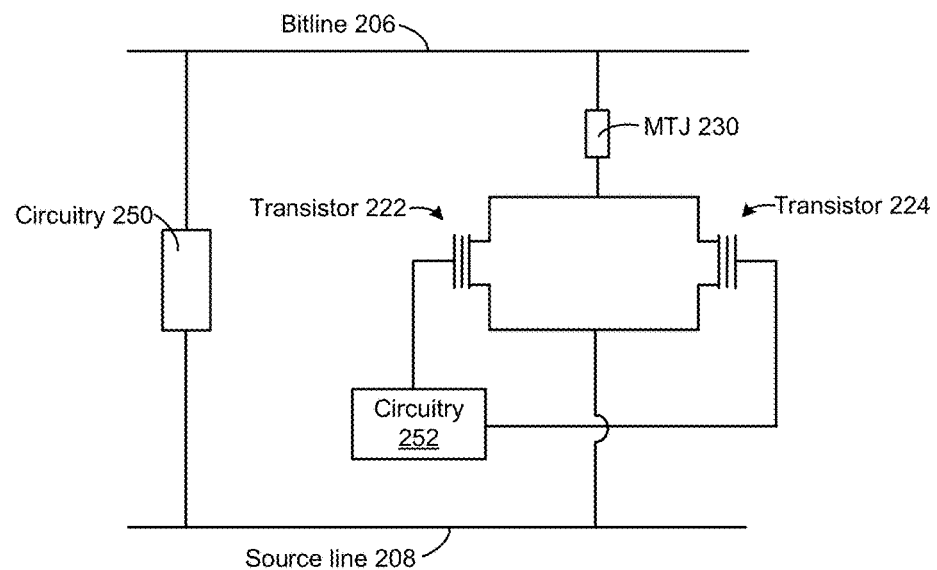

FIGS. 2E-2G are schematic diagrams illustrating representative circuits with dual threshold memory devices in accordance with some implementations. FIG. 2E shows a device 221 including transistors 222 and 224. The transistors 222 and 224 have charge storage layers 210 and 212 respectively. In some implementations, the charge storage layers 210 and 212 comprise charge traps (e.g., nitride charge traps). In some implementations, the charge storage layers comprise floating gate layers. In some implementations, the charge layers 210 and 212 are each configured to store one or two bits. For example, the charge storage layers comprise floating gates configured to selectively store a charge (corresponding to a logical "1" state). As another example, the charge storage layers comprise nitride traps configured to selectively and independently store charge on the source and drain sides of the gate. In this example, charge stored on the source side represents a logical "1" state for a first bit and charge stored on the drain side represents a logical "1" state for a second bit.

In accordance with some implementations, the device 221 comprises device 100, where the first input terminal 112 corresponds to the gate of the transistor 222 and the second input terminal 114 corresponds to the gate of the transistor 224. In some implementations, the device 221 is coupled to a bitline 206, e.g., the drains of the transistors 222 and 224 are coupled to the bitline 206. In some implementations, the device 221 is coupled to a source line 208, e.g., the sources of the transistors 222 and 224 are coupled to the source line 208.

FIG. 2F shows the device 221 coupled in series with a magnetic tunnel junction (MTJ) memory device 230. In some implementations, the device 221 is configured to adjust an input current for the MTJ 230, e.g., to adjust bit error rates of the MTJ 230. In some implementations, the device 221 is coupled to one or more MTJs (e.g., two MTJs in series with one another) and is configured to selectively supply distinct input currents to the one or more MTJs. For example, the device 221 is configured to supply a first current to write to a first MTJ and the device 221 is configured to supply a second current to write to the second MTJ (or to write a different value to the first MTJ).

FIG. 2G shows the device 221 coupled in series with the MTJ 230 and coupled to circuitry 250 and 252. In some implementations, the circuitry 252 is configured to govern operation of the transistors 222 and 224, e.g., selectively enables the transistors to adjust an amount of current supplied to the MTJ 230. In some implementations, the circuitry 250 is configured to determine a bit error rate of the MTJ 230 and determine an input current adjustment for the MTJ 230. In some implementations, the circuitry 250 (e.g., in conjunction with the circuitry 252) adjusts operation of the transistor 222 and/or the transistor 224 so as to make an adjustment to the input current for the MTJ 230. In some implementations, the circuitry 250 (e.g., in conjunction with the circuitry 252) adjusts the charge stored in the transistor 222 and/or the transistor 224 so as to make an adjustment to the input current for the MTJ 230. In some implementations, the circuitry 250 repeatedly adjusts the input current until a desired bit error rate for the MTJ is achieved.

Figure 2H:
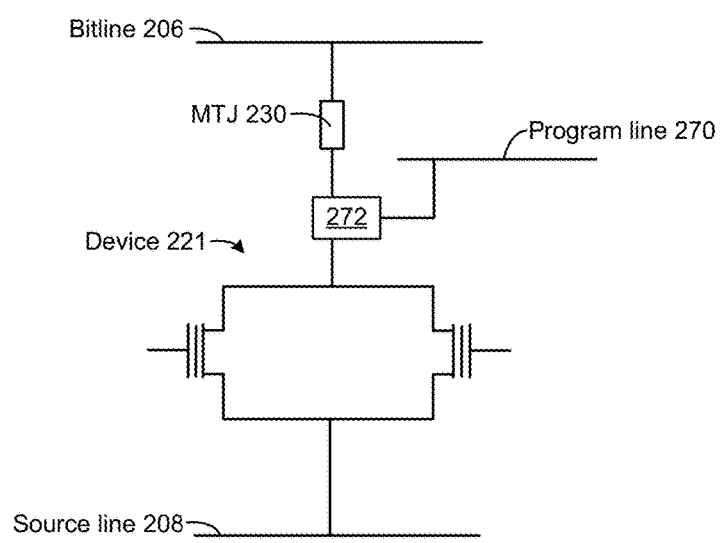

FIG. 2H shows the device 221 coupled in series with the magnetic tunnel junction (MTJ) memory device 230, similar to FIG. 2F, and coupled to a program line 270 via bypass circuitry 272. In some implementations, the device 221 is configured to adjust an input current for the MTJ 230, e.g., to adjust bit error rates of the MTJ 230. In some implementations, the device 221 is coupled to one or more MTJs (e.g., two MTJs in series with one another) and is configured to selectively supply distinct input currents to the one or more MTJs. For example, the device 221 is configured to supply a first current to write to a first MTJ and the device 221 is configured to supply a second current to write to the second MTJ (or to write a different value to the first MTJ). In some implementations, the bypass circuitry 272 comprises a switch (e.g., a transistor) which is selectively enabled to program (e.g., write to) the device 221. In some implementations, the program line 270 is separate and distinct from the bitline 206, while in other implementations, the program line 270 is the bitline 206. In some implementations, the bypass circuitry 272 is coupled in parallel with the MTJ 230 and selectively activated such that a voltage is supplied to the device 221 but not the MTJ 230 (e.g., so as not to disrupt a state of the MTJ 230 when programming the device 221). In some implementations, the bitline 206 is utilized to write to the MTJ 230 and the program line 270 is utilized to write to the device 221. In some implementations, for writing to the device 221, the bypass circuitry 272 decouples the MTJ 230 from the device 221 and couples the device 221 to the program line 270. In some implementations, for operations involving the MTJ (e.g., reading/writing to the MTJ), the bypass circuitry 272 decouples the device 221 from the program line 270 and couples the device 221 to the MTJ 230.

Figure 3A:
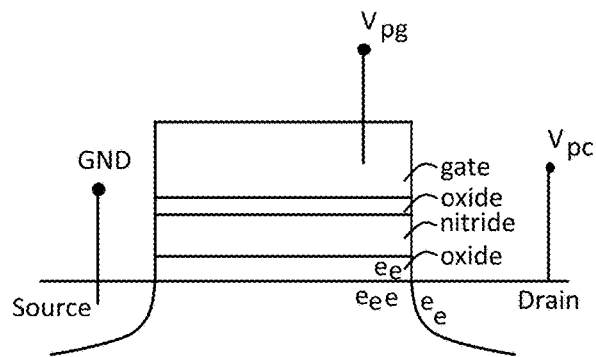
FIGS. 3A-3B illustrate charge trapping in a representative memory device in accordance with some implementations.
Figure 3B:
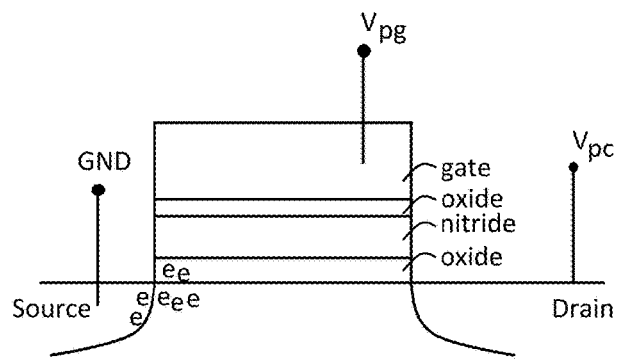

FIGS. 3A-3B illustrate charge trapping in a representative memory device in accordance with some implementations. FIG. 3A shows a three-terminal device 300 (e.g., the transistor 220) with a source 308 coupled to a reference node (e.g., GND 306), a gate coupled to a voltage source $V_{pg}$ 302, and a drain 310 coupled to a second voltage source $V_{pc}$ 304. A voltage differential between the source and the drain (e.g., between the GND 306 and the voltage source $V_{pc}$) causes electrons to become trapped at the drain-side of the gate (e.g., in the nitride trap) in accordance with some implementations. The device 300 includes a charge layer (e.g., charge layer 210) composed of a nitride layer between two oxide layers under the gate of the device 300.

FIG. 3B shows the three-terminal device 300 with electrons trapped at the source-side of the gate in accordance with some implementations. A voltage differential between the source and the drain (e.g., between the GND 306 at the drain-side and the voltage source $V_{pc}$ 304 at the source-side) causes electrons to become trapped at the drain-side of the gate (e.g., in the nitride trap) in accordance with some implementations.

FIGS. 4A-4C are graphical representations illustrating prophetic voltage distributions in a representative dual threshold memory device in accordance with some implementations. FIG. 4A shows a voltage distribution for a two-bit memory cell. Conventional multilevel schemes for charge-based nonvolatile memory utilize different numbers of charges in a single charge storage. The problem with the conventional approach is reduced separation between the 00, 01, 10, and 11 states due to reduced charge storage associated with geometry scaling. The dual threshold memory devices disclosed herein (e.g., device 221) have advantages over conventional approaches in that the devices store charge in distinct locations (e.g., the source-side and drain-side of transistors 222 and 224), enabling larger separation between the logical "0" and logical "1" states. FIG. 4B shows an example separation 302 between the "0" and "1" states on the source-side of a transistor. FIG. 4C shows another example separation 304 between the "0" and "1" states on the drain-side of the transistor. In some implementations, the source-side and drain-side of the transistor are read out individually and, the two transistors are configured so as to have varying separations such that when read out together the 00, 01, 10, and 11 states are distinguishable.

Figure 4D:
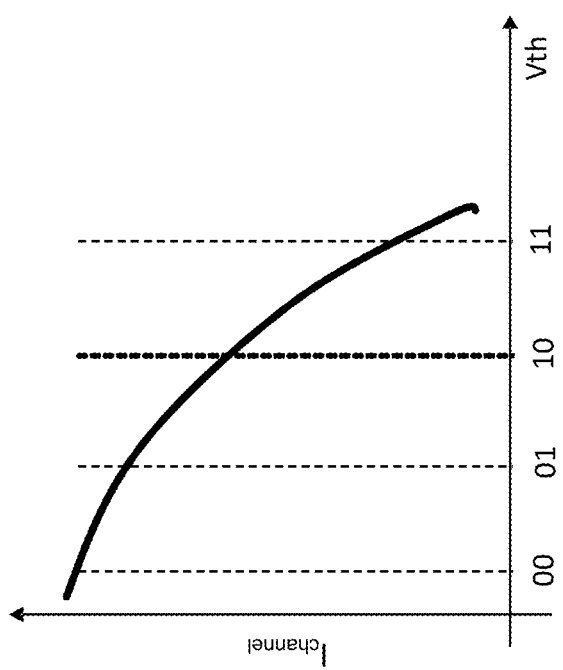
FIG. 4D is a graphical representation illustrating prophetic channel currents for a representative dual threshold voltage device in accordance with some implementations.

FIG. 4D is a graphical representation illustrating prophetic channel currents for a representative dual threshold voltage device in accordance with some implementations. FIG. 4D illustrates a change in channel current supplied to an MTJ (e.g., MTJ 230) corresponding to states of a charge storage transistor (e.g., the transistor 222). As shown in FIG. 4D, when the transistor is in a "00" state more current is supplied to the MTJ than when the transistor is in a "01", "10", or "11" state. Thus, by changing the state of the charge storage transistor different currents are supplied to the MTJ 230 in accordance with some implementations. A dual threshold device (e.g., the device 221) includes two transistors in parallel and thus a current supplied to the MTJ (e.g., MTJ 23) is a sum of the currents from the two transistors (e.g., from the transistors 222 and 224). Thus, in accordance with some implementations, a dual threshold device, such as device 221, is enabled to provide a large dynamic current to a coupled MTJ, such as MTJ 230. In accordance with some implementations, the supplied current from each transistor is given by Equation 1 below.

$$I_D(sat) = \frac{\mu_n C_{ox}}{2} \frac{W}{L} [2(V_{GS} - V_{T0})(V_{GS} - V_{T0}) - (V_{GS} - V_{T0})^2] = \frac{\mu_n C_{ox}}{2} \frac{W}{L} (V_{GS} - V_{T0})^2 \quad \text{Equation 1}$$

In Equation 1 above, $\mu_n$ is the mobility of n-channel MOSFET, W is the width of MOSFET, L is the length of MOSFET, $C_{ox}$ is the gate capacitance of MOSFET, $V_{GS}$ is the voltage across gate and source terminal, $V_{T0}$ is the threshold voltage of MOSFET, and $I_D$ (sat) is the current between source and drain terminals.

Figure 5A:
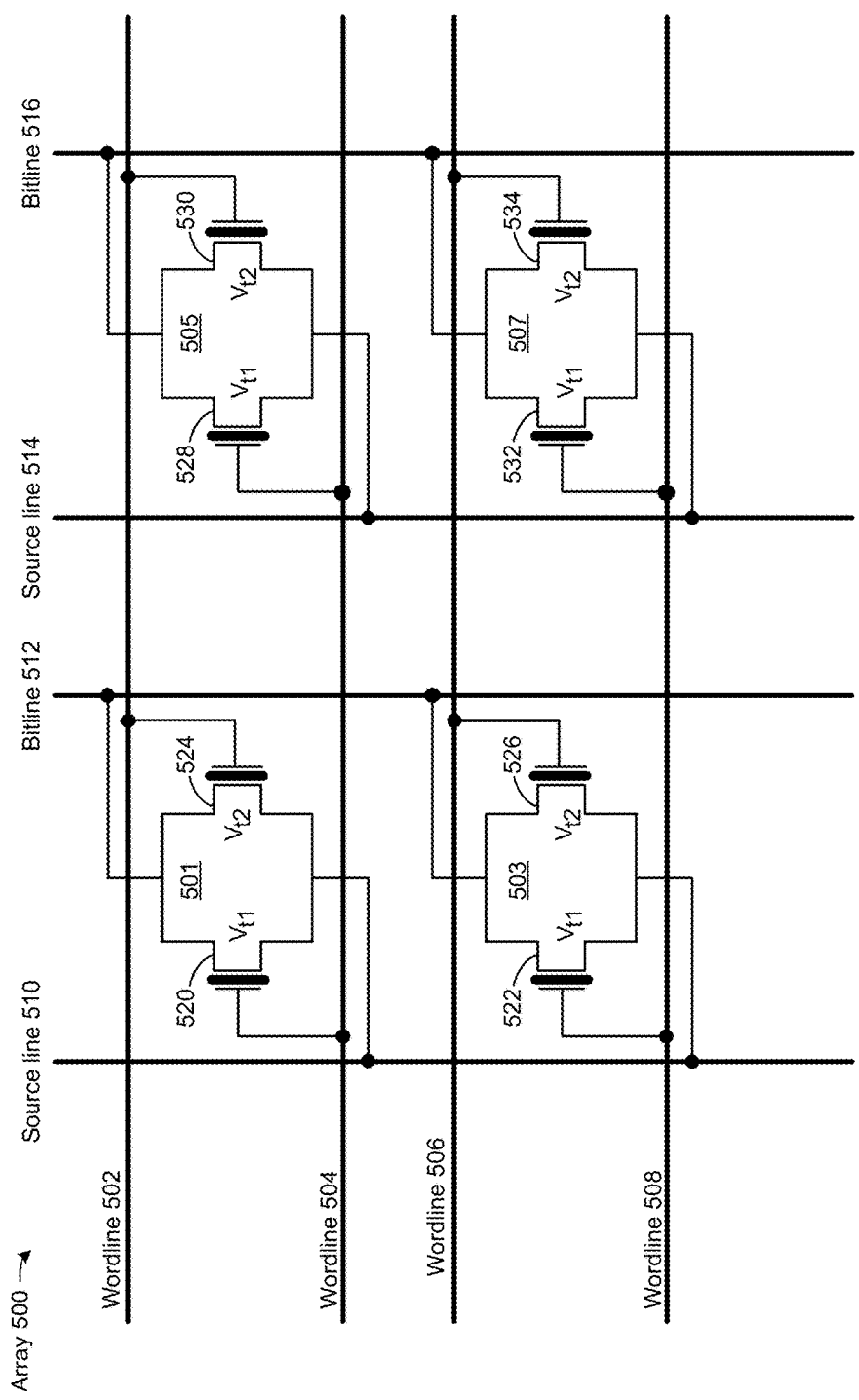
FIG. 5A is a schematic diagram illustrating a representative memory array with dual threshold memory devices in accordance with some implementations.
Figure 5B:
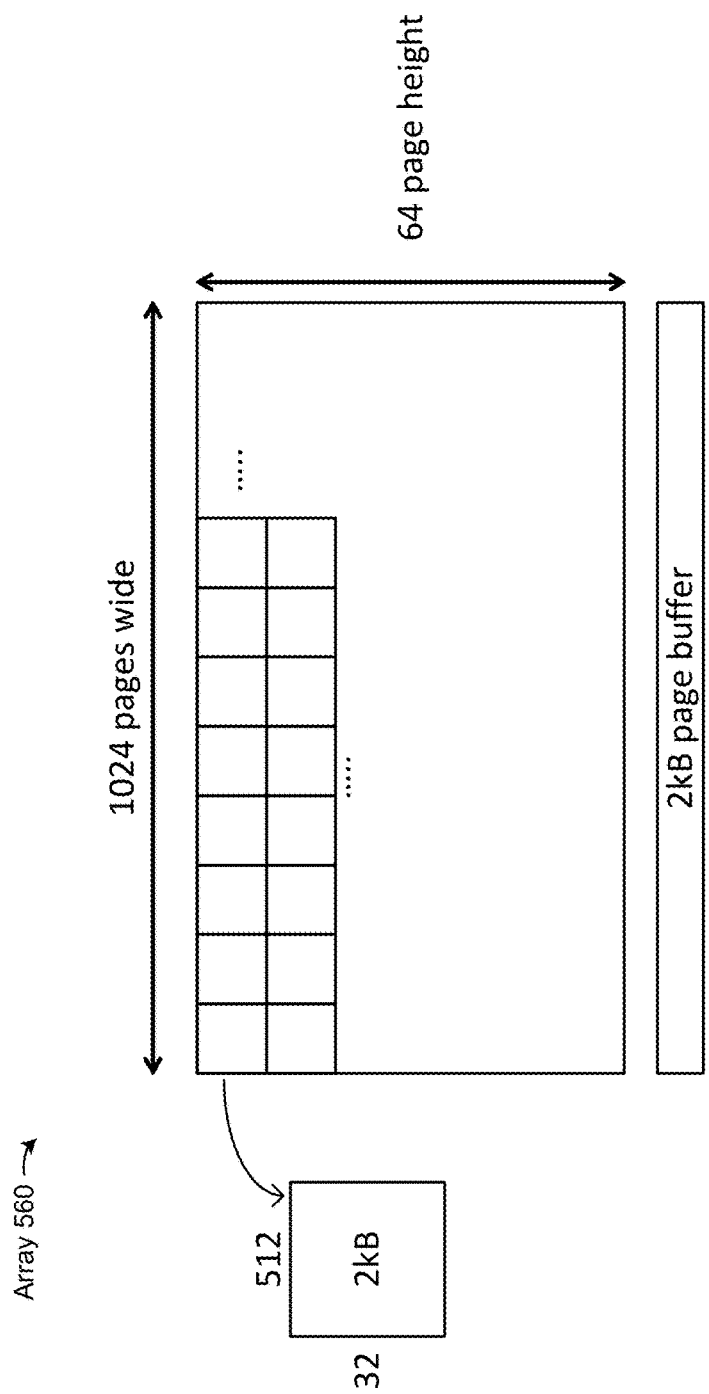
FIG. 5B is a block diagram illustrating a representative memory array with dual threshold memory devices in accordance with some implementations.

FIG. 5A is a schematic diagram illustrating a representative memory array with dual threshold memory devices in accordance with some implementations. FIG. 5A shows the memory array 500 including a plurality of dual threshold devices (e.g., the device 221) coupled to respective wordlines, source lines, and bitlines. In FIG. 5A, the devices 501 and 503 are coupled to a source line 510 and a bit line 512 and devices 505 and 507 are coupled to a source line 514 and a bitline 516. The gates of transistors 520 and 528 are coupled to wordline 504, the gates of transistors 524 and 530 are coupled to the wordline 502, the gates of transistors 522 and 532 are coupled to the wordline 508, and the gates of transistors 526 and 534 are coupled to the wordline 506. In some implementations, the transistors 520 through 534 have a charge storage layer that comprises a floating gate (e.g., configured to store a single bit). In some implementations, the transistors 520 through 534 have a charge storage layer that comprises a charge trap (e.g., configured to store one or more bits). In some implementations, the memory array 500 includes more rows and/or columns than shown in FIG. 5A. In some implementations, the memory array 500 includes multiple pages. For example, as shown in FIG. 5B, each page is optionally 8 kilobytes (KB) and includes 512 columns and 32 rows. In some implementations, the array 500 comprises the memory array 560 in FIG. 5B, which is arranged so as to be 1024 pages wide and 64 pages high. As another example, the memory array 500 is arranged so as to be 256 pages wide and 256 pages high.

In accordance with some implementations, each memory cell (e.g., each dual threshold device) stores four or more bits. In some implementations, parallel writing is performed in a row-wise manner. In some implementations, each bitline (e.g., the bitline 512) is configured to supply a plurality of currents to the coupled memory cells. In the example of FIG. 5B, each page includes 32 rows and thus each bitline is configured to supply current(s) to 32 memory cells. In some implementations, the array 560 is configured to optimize a power-requirement in the bitline and parallelism in the write operation. For example, the array 560 is arranged to have 32 rows and 512 columns as shown in the example of FIG. 5B.

Figure 6A:
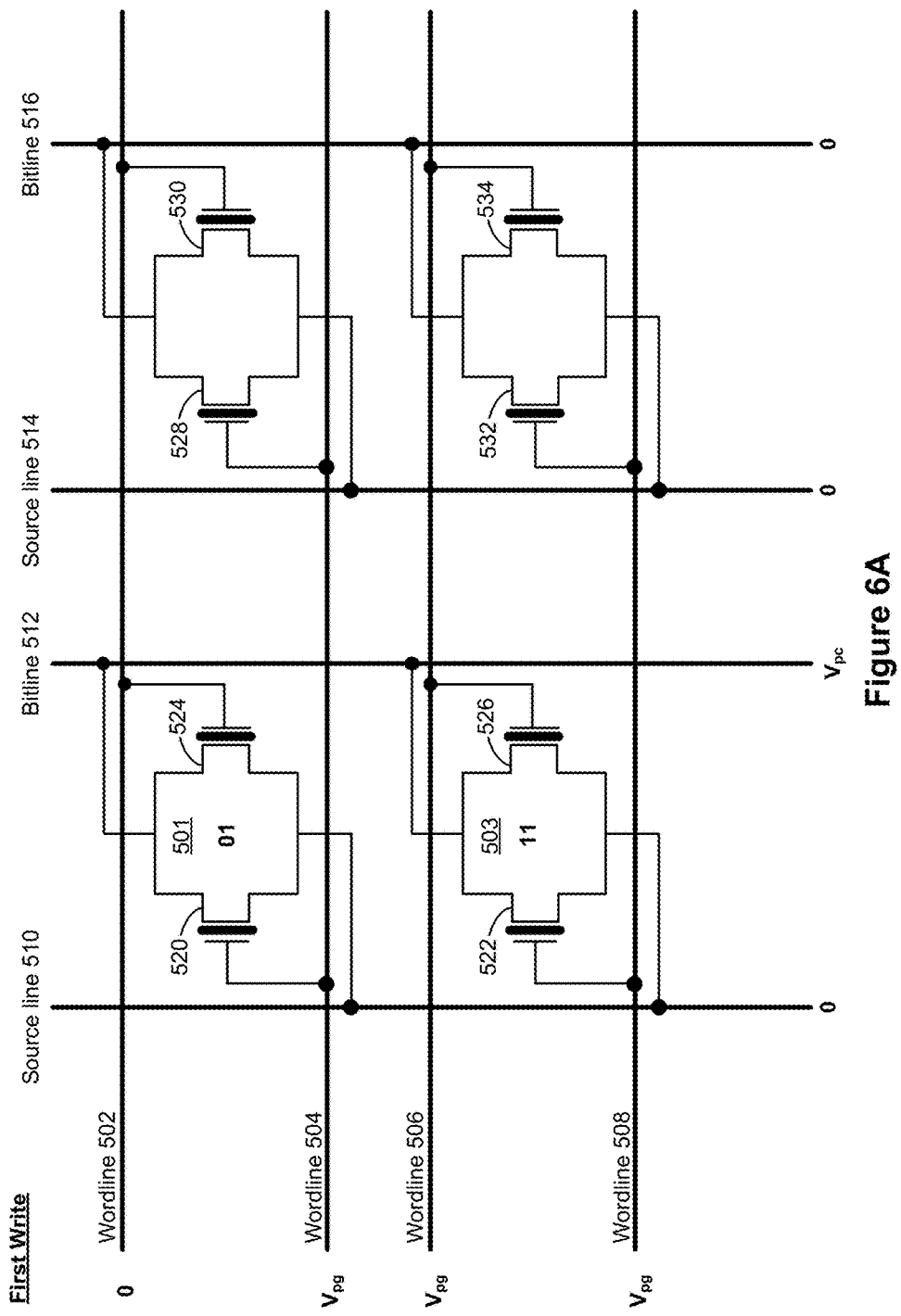
FIGS. 6A-6B illustrate a write process for the representative memory array of FIG. 5 in accordance with some implementations.
Figure 6B:
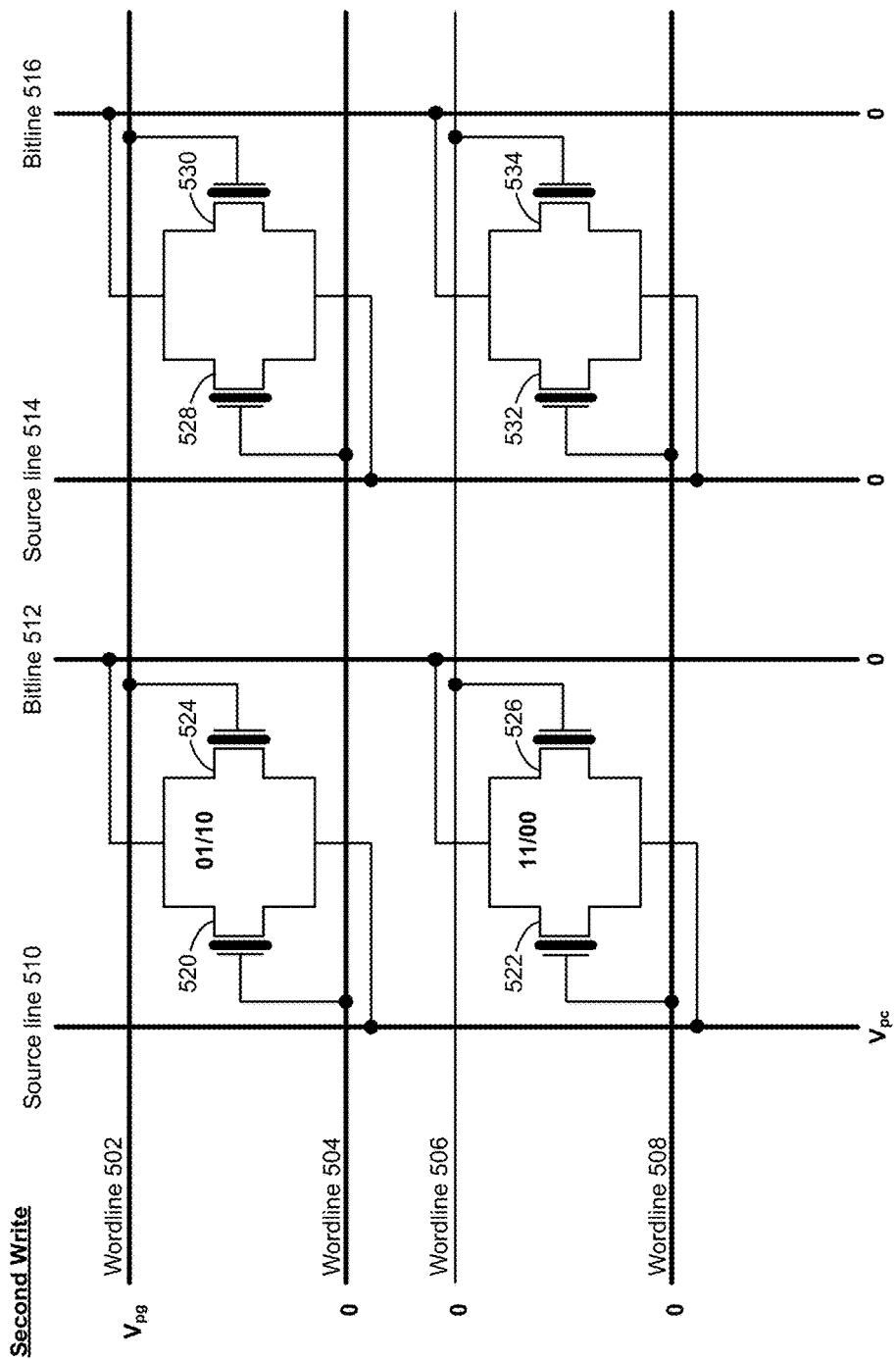

FIGS. 6A-6B illustrate a write process for the memory array 500 of FIG. 5 in accordance with some implementations. FIG. 6A shows inputs for a first write to the devices 501 and 503 of the memory array 500. In FIG. 6A, the wordline 502 is at a "0" voltage level (e.g., is electrically-coupled to a ground node), and the wordlines 504, 506, and 508 are at a $V_{pg}$ voltage level (e.g., are electrically-coupled to a voltage source). Also, the bitline 512 is at a $V_{pc}$ voltage level and the source line 510 is at a "0" voltage level (e.g., is electrically-coupled to a ground node). Due to the bitline 512 being active (e.g., at voltage level $V_{pc}$) the value of the wordlines is written into the devices 501 and 503 (e.g., into a source-side charge trap). Thus, as shown in FIG. 6A, "01" is written to the device 501 and "11" is written to the device 503.

FIG. 6B shows inputs for a second write to the devices 501 and 503 of the memory array 500 (e.g., subsequent to the first write illustrated in FIG. 6A). In FIG. 6B, the wordline 502 is at the $V_{pg}$ voltage level and the wordlines 504, 506, and 508 are at a "0" voltage level. Also, the bitline 512 is at a "0" voltage level and the source line 510 is at a $V_{pc}$ voltage level. Due to the source line 510 being active (e.g., at voltage level $V_{pc}$) the value of the wordlines is written into the devices 501 and 503 (e.g., into a drain-side charge trap). Thus, as shown in FIG. 6B, "10" is written to the device 501 and "00" is written to the device 503. In implementations with transistors capable of storing multiple bits (e.g., with source-side and drain-side charge traps), the first write illustrated in FIG. 6A corresponds to a first set of bits and the second write illustrated in FIG. 6B corresponds to a second set of bits. Thus in some implementations, after both writes, the device 501 stores "0110" and the device 503 stores "1100."

Figure 7B:
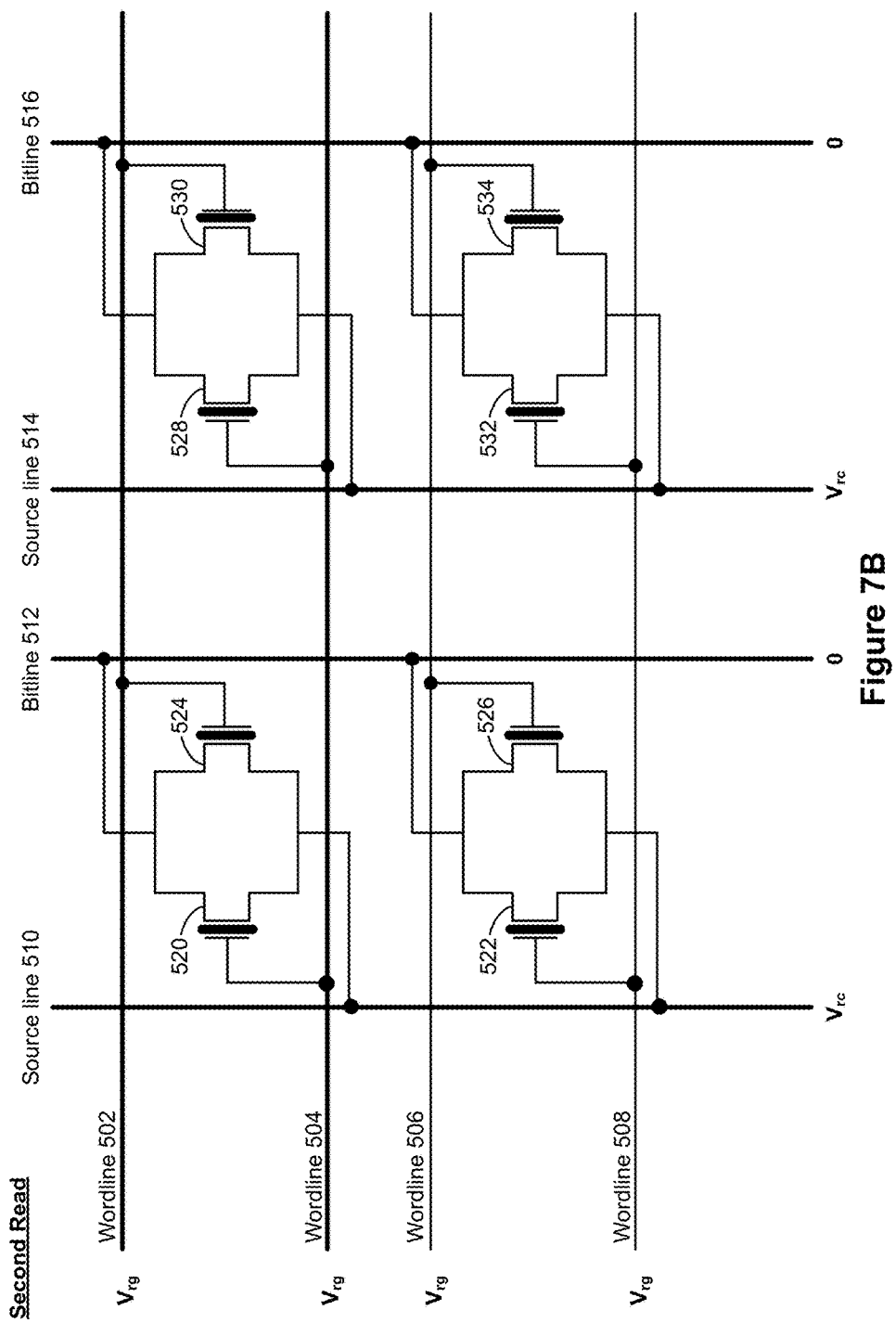

FIGS. 7A-7B illustrate a read process for the memory array 500 of FIG. 5 in accordance with some implementations. FIG. 7A shows inputs for a first read of the devices 501, 503, 505, and 507 of the memory array 500. In FIG. 7A, the wordlines 502, 504, 506, and 508 are at a $V_{rg}$ voltage level (e.g., are electrically-coupled to a voltage source). Also, the bitlines 512 and 516 are at a $V_{rc}$ voltage level and the source lines 510 and 514 are at a "0" voltage level. Due to the bitlines 512 and 516 being active (e.g., at voltage level $V_{rc}$) the values stored in the devices are read. As shown in Table 1 below, during a read operation the bitlines 512 and 516 are driven to a lower voltage level than during a write operation (e.g., $V_{rc} < V_{pc}$) to prevent unintentionally writing to the devices. In some implementations, reading from the devices with the bitlines 512 and 516 at a $V_{rc}$ voltage level reads from a source-side trap of the transistors (e.g., reads the values stored in the operation illustrated in FIG. 6A).

FIG. 7B shows inputs for a second read of the devices 501, 503, 505, and 507 of the memory array 500. In FIG. 7B, the bitlines 512 and 516 are at a "0" voltage level and the source lines 510 and 514 are at a $V_{rc}$ voltage level. Due to the source lines 510 and 514 being active (e.g., at voltage level $V_{rc}$) the values stored in the devices are read. As shown in Table 1 below, during a read operation the source lines 510 and 514 are driven to a lower voltage level than during a write operation to prevent unintentionally writing to the devices. In some implementations, reading from the devices with the source lines 510 and 514 at a $V_{rc}$ voltage level reads from a drain-side trap of the transistors (e.g., reads the values stored in the operation illustrated in FIG. 6B). Example voltages for reading and writing to the memory array 500 are shown below in Table 1.

Although the wordlines, bitlines, and source lines described above in reference to FIGS. 6 & 7 describe a "0" voltage level, in some implementations, rather than being at a grounded voltage level the wordlines, bitlines, and/or source lines are driven to a non-zero voltage level that is less than the voltage level corresponding to an active "1" state (e.g., are driven to voltage levels that are less than $V_{pg}$ and $V_{rc}$ respectively).

TABLE 1

Example operating voltages

|  | Wordline 1 | Wordline 2 | Sourceline 1 | Bitline 1 |
|---|---|---|---|---|
| Programming Phase 1 (1st 2 bits) | Writing 1 on first bit: Vpg (3.5 V-4.0 V) Writing 0 on first bit: GND | Writing 1 on second bit: Vpg (3.5 V-4.0 V) Writing 0 on second bit: GND | GND | Vpc (2.5 V-3.0 V) |
| Programming Phase 2 (2nd 2 bits) | Writing 1 on first bit: Vpg (3.5 V-4.0 V) Writing 0 on first bit: GND | Writing 1 on second bit: Vpg (3.5 V-4.0 V) Writing 0 on second bit: GND | Vpc (2.5 V-3.0 V) | GND |
| Reading Phase 1 (1st 2 bits) | $V_{rg}$ (GND-1.2 V) | $V_{rg}$ (GND-1.2 V) | Vrc (0.6 V) | GND |
| Reading Phase 2 (2nd 2 bits) | $V_{rg}$ (GND - 1.2 V) | $V_{rg}$ (GND-1.2 V) | GND | Vrc (0.6 V) |

In light of these principles, we now turn to certain implementations.

In accordance with some implementations, a memory device (e.g., the device 221, FIG. 2E) includes: (1) a first charge storage device (e.g., the transistor 222) having a first gate with a corresponding first threshold voltage, the first charge storage device configured to store charge corresponding to one or more first bits; and (2) a second charge storage device (e.g., the transistor 224) having a second gate with a corresponding second threshold voltage, distinct from the first threshold voltage, the second charge storage device configured to store charge corresponding to one or more second bits; where the second charge storage device is coupled in parallel with the first charge storage device. In some implementations, the charge storage devices comprise N-channel, P-channel, or CMOS devices.

In some implementations: (1) the first charge storage device comprises a transistor; and (2) the first gate comprises a floating gate configured to store the charge corresponding to the one or more first bits. In some implementations, both storage devices have floating gates.

In some implementations: (1) the first charge storage device comprises a transistor; and (2) the first gate comprises a nitride trap configured to store the charge corresponding to the one or more first bits. In some implementations, both storage devices have nitride traps. In some implementations, charge traps other than nitride are provided, such as silicon nanocrystal or metallic nanocrystal (e.g. Co, Ni) embedded in insulating silicon oxide, $Ti_{0.2}Al_{0.8}O_x$, and the like.

In some implementations, the first charge storage device is configured to: (1) store charge corresponding to a first bit of the one or more first bits on a drain-side of the first gate (e.g., as illustrated in FIG. 3A); and (2) store charge corresponding to a second bit of the one or more first bits on a source-side of the first gate (e.g., as illustrated in FIG. 3B).

In some implementations, a channel of the first charge storage device is electrically-insulated from a channel of the second charge storage device. For example, the channel of the first device is separated from a channel of the second device by a common drain layer (e.g., as shown in FIG. 1A).

In some implementations, a channel doping of the first charge storage device is distinct from a channel doping of the second charge storage device. In some implementations, the distinct dopings yield the differing threshold voltages of the first and second charge storage devices.

In some implementations, a work function of the first charge storage device is distinct from a work function of the second charge storage device. The work function for a charge storage device is the energy required to take an outermost valence electron from element atom. The work function generally depends on microcrystalline structure (e.g., direction, strain, etc.) of metal, grain boundary structure, and/or electronic band structure of the element. By having various gate electrodes with different work functions, different voltage thresholds are achieved. In some implementations and instances, the voltage threshold of a charge storage device is linearly proportional to the work function of its gate electrode.

In some implementations: (1) the memory device further includes a bitline (e.g., the bitline 206, FIG. 2E); and (2) a first terminal of the first charge storage device and a first terminal of the second charge storage device are each coupled to the bitline. In some implementations, the first terminal is on a drain-side of the first and second storage devices.

In some implementations: (1) the memory device further includes a source line (e.g., the source line 208, FIG. 2E); and (2) a second terminal of the first charge storage device and a second terminal of the second charge storage device are each coupled to the source line. In some implementations, the second terminal is on a source-side of the first and second storage devices.

In some implementations: (1) the memory device further includes a first wordline (e.g., wordline 504, FIG. 5) and a second wordline (e.g., wordline 502, FIG. 5); and (2) the first gate is coupled to the first wordline and the second gate is coupled to the second wordline.

In accordance with some implementations, a memory device includes: (1) a magnetic memory component (e.g., the MTJ 230, FIG. 2F); (2) a current selector component (e.g., the device 221, FIG. 2F) coupled to the magnetic memory component, the current selector component including: (a) a first transistor (e.g., the transistor 222) having a first gate with a corresponding first threshold voltage; and (b) a second transistor (e.g., the transistor 224) having a second gate with a corresponding second threshold voltage, distinct from the first threshold voltage; where the second transistor is coupled in parallel with the first transistor.

In some implementations: (1) the memory device further includes a source line (e.g., the source line 208, FIG. 2F); and (2) the magnetic memory component is coupled to the source line via the current selector component.

In some implementations: (1) the memory device further includes a first wordline and a second wordline; and (2) the first gate is coupled to the first wordline and the second gate is couple to the second wordline.

In some implementations, the current selector component is configured to selectively supply a plurality of currents to the magnetic memory component (e.g., determined by which gates are activated). For example, the current selector component is configured to supply the currents shown in FIG. 4D.

In some implementations, the memory device further includes control circuitry (e.g., the control circuitry 250 and/or the control circuitry 252, FIG. 2G) configured to select a particular current of the plurality of currents based on a temperature of the magnetic memory component (e.g., by enabling the first gate and/or the second gate).

In some implementations, the memory device further includes control circuitry (e.g., the control circuitry 250 and/or the control circuitry 252, FIG. 2G) configured to select a particular current of the plurality of currents based on a desired error rate for the magnetic memory component (e.g., increasing the current supplied to the MTJ decreases the bit error rate).

In some implementations, the first transistor includes a charge storage layer (e.g., the charge layer 210, FIG. 2F) configured to selectively store charge so as to adjust a current through the first transistor. In some implementations, the charge storage layer is a floating gate or charge trap (e.g., a nitride trap).

In some implementations, the memory device further includes control circuitry (e.g., the control circuitry 250 and/or the control circuitry 252, FIG. 2G) configured to adjust a charge stored in the charge storage layer so as to adjust a current through the first transistor (e.g., based on a current temperature or desired bit error rate (BER) for the magnetic memory.)

In some implementations, the memory device further includes control circuitry (e.g., the control circuitry 250 and/or the control circuitry 252, FIG. 2G) configured to: (1) determine a bit error rate of the magnetic memory component; and (2) adjust a charge stored in the charge storage layer based on the determined bit error rate. In some implementations, this process is repeated until the determined bit error rate is within a predetermined threshold of a desired bit error rate (e.g., within 20%, 10%, or 1% of the desired error rate).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first device could be termed a second device, and, similarly, a second device could be termed a first device, without departing from the scope of the various described implementations. The first device and the second device are both electronic devices, but they are not the same device unless it is explicitly stated otherwise.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A memory device, comprising:
    a magnetic memory component;
    a current selector component coupled to the magnetic memory component, the current selector component comprising:
        a first transistor having a first gate with a corresponding first threshold voltage, wherein the first transistor comprises a charge storage layer configured to selectively store charge so as to adjust a current through the first transistor; and
        a second transistor coupled in parallel with the first transistor, the second transistor having a second gate with a corresponding second threshold voltage, distinct from the first threshold voltage; and
    control circuitry configured to:
        determine a bit error rate of the magnetic memory component; and
        adjust a charge stored in the charge storage layer based on the determined bit error rate.

2. The memory device of claim 1, further comprising a source line; and
    wherein the magnetic memory component is coupled to the source line via the current selector component.

3. The memory device of claim 1, further comprising a first wordline and a second wordline; and
    wherein the first gate is coupled to the first wordline and the second gate is coupled to the second wordline.

4. The memory device of claim 1, wherein the current selector component is configured to selectively supply a plurality of currents to the magnetic memory component.

5. The memory device of claim 4, wherein the plurality of currents corresponds to a plurality of current thresholds for reading and writing to the magnetic memory component.

6. The memory device of claim 4, wherein the control circuitry is configured to select a particular current of the plurality of currents based on a temperature of the magnetic memory component.

7. The memory device of claim 4, wherein the control circuitry is configured to select a particular current of the plurality of currents based on a desired error rate for the magnetic memory component.

8. The memory device of claim 1, wherein the charge storage layer is a floating gate or charge trap.

9. The memory device of claim 1, wherein the control circuitry is configured to repeat the determining and the adjusting until the determined bit error rate is within a desired bit error range.

10. The memory device of claim 1, further comprising a bitline; and
   wherein the current selector component is coupled to the bitline via the magnetic memory component.

11. The memory device of claim 10, wherein the current selector component is further coupled to the bitline via bypass circuitry configured to bypass the magnetic memory component.

12. The memory device of claim 10, further comprising a program line; and
   wherein the current selector component is coupled to the program line via bypass circuitry configured to selectively couple the current selector component to the program line and selectively decouple the magnetic memory component from the current selector component.

* * * * *